(12) United States Patent
Dissanayake et al.

(10) Patent No.: US 8,502,195 B2
(45) Date of Patent: Aug. 6, 2013

(54) CARBON NANOTUBE HYBRID PHOTOVOLTAICS

(75) Inventors: Nanditha Dissanayake, Ann Arbor, MI (US); Zhaohui Zhong, Ann Arbor, MI (US)

(73) Assignee: The Regents of the University of Michigan, Ann Arbor, MI (US)

( * ) Notice: Subject to any disclaimer, the term of this patent is extended or adjusted under 35 U.S.C. 154(b) by 0 days.

(21) Appl. No.: 13/179,885

(22) Filed: Jul. 11, 2011

(65) Prior Publication Data

US 2012/0007046 A1 Jan. 12, 2012

Related U.S. Application Data

(60) Provisional application No. 61/363,103, filed on Jul. 9, 2010.

(51) Int. Cl.
*H01L 29/06* (2006.01)
(52) U.S. Cl.
USPC ........ 257/14; 257/E51.015; 438/82; 977/750; 977/954
(58) Field of Classification Search
USPC .............................. 257/14, E51.015; 136/263
See application file for complete search history.

(56) References Cited

U.S. PATENT DOCUMENTS

| 7,897,429 | B2 * | 3/2011 | Forrest et al. ................... 438/99 |
| 8,017,863 | B2 * | 9/2011 | Forrest et al. ................. 136/263 |
| 8,093,489 | B2 * | 1/2012 | Sager et al. ................... 136/250 |
| 2002/0084504 | A1 * | 7/2002 | Narayan ........................ 257/462 |
| 2003/0201010 | A1 | 10/2003 | Koyanagi et al. |
| 2005/0121068 | A1 | 6/2005 | Sager et al. |
| 2005/0133782 | A1 * | 6/2005 | Klauk et al. .................... 257/40 |
| 2006/0076050 | A1 * | 4/2006 | Williams et al. ............. 136/263 |
| 2007/0029912 | A1 * | 2/2007 | Park et al. ..................... 313/310 |
| 2007/0158642 | A1 * | 7/2007 | Gruner ........................... 257/40 |
| 2008/0066802 | A1 * | 3/2008 | Reddy ........................... 136/258 |
| 2008/0116536 | A1 * | 5/2008 | Forrest et al. ................. 257/431 |
| 2008/0264473 | A1 | 10/2008 | Cumpston et al. |
| 2008/0295889 | A1 * | 12/2008 | Schindler et al. ............. 136/263 |

(Continued)

FOREIGN PATENT DOCUMENTS

WO 2004/096725 A2 11/2004

OTHER PUBLICATIONS

International Search Report and Written Opinion mailed Dec. 6, 2011.

(Continued)

*Primary Examiner* — N Drew Richards
*Assistant Examiner* — Ankush Singal
(74) *Attorney, Agent, or Firm* — Howard & Howard Attorneys PLLC (57) ABSTRACT

Systems, methods and devices for the efficient photocurrent generation in single- or multi-walled carbon nanotubes, which includes (SWNTs)/poly [3-hexylthiophene-2,5-diyl] (P3HT) hybrid photovoltaics, and exhibit the following features: photocurrent measurement at individual SWNT/P3HT heterojunctions indicate that both semiconducting (s-) and metallic (m-) SWNTs function as excellent hole acceptors; electrical transport and gate voltage dependent photocurrent indicate that P3HT p-dopes both s-SWNT and m-SWNT, and exciton dissociation is driven by a built-in voltage at the heterojunction. Some embodiments include a $mm^2$ scale SWNT/P3HT bilayer hybrid photovoltaics using horizontally aligned SWNT arrays, which exhibit greater than 90% effective external quantum efficiency, among other things, which advantageously provide carbon nanomaterial based low cost and high efficiency hybrid photovoltaics.

20 Claims, 6 Drawing Sheets

U.S. PATENT DOCUMENTS

| | | | |
|---|---|---|---|
| 2009/0001325 A1* | 1/2009 | Huo et al. | 252/511 |
| 2009/0038681 A1* | 2/2009 | Trancik et al. | 136/256 |
| 2009/0084444 A1* | 4/2009 | Sun | 136/263 |
| 2009/0085012 A1* | 4/2009 | Chochos et al. | 252/501.1 |
| 2009/0176994 A1* | 7/2009 | Laird et al. | 549/29 |
| 2009/0205713 A1* | 8/2009 | Mitra et al. | 136/263 |
| 2009/0224230 A1* | 9/2009 | Pesetski et al. | 257/24 |
| 2009/0266418 A1* | 10/2009 | Hu et al. | 136/260 |
| 2009/0267060 A1* | 10/2009 | Forrest et al. | 257/40 |
| 2009/0271982 A1* | 11/2009 | Lee et al. | 29/846 |
| 2009/0321721 A1* | 12/2009 | Malenfant et al. | 257/40 |
| 2010/0127247 A1* | 5/2010 | Yang et al. | 257/40 |
| 2010/0132782 A1* | 6/2010 | Laird et al. | 136/256 |
| 2010/0133516 A1* | 6/2010 | Lee et al. | 257/40 |
| 2010/0313944 A1* | 12/2010 | Curran et al. | 136/255 |
| 2011/0203632 A1* | 8/2011 | Sen et al. | 136/244 |
| 2011/0214728 A1* | 9/2011 | Veerasamy | 136/256 |
| 2011/0253206 A1* | 10/2011 | Maeda et al. | 136/255 |

OTHER PUBLICATIONS

Sun, et al., "Organic Photovoltaics: Mechanisms, Materials and Devices", 2005, 3 Chapters of Book (4, 6 and 15), total pp. 92, CRC Press, Florida.

Gregg, et al., "Comparing organic to inorganic photovoltaic cells: Theory, experiment, and simulation", Journal of Applied Physics, 2003, pp. 3605-3614, vol. 93.

Peumans, et al., "Small molecular weight organic thin-film photodetectors and solar cells", Journal of Applied Physics, Apr. 1, 2003, pp. 3693-3723, vol. 93, No. 7.

Blom, et al., "Device Physics of Polymer: Fullerence Bulk Heterojunction Solar Cells", Advanced Materials, 2007, pp. 1551-1566, vol. 19, WILEY-VCH Verlag GmbH & Co. KGaA, Weinheim.

Shrotriya, Vishal, "Polymer power", Nature Photonics, Aug. 2009, pp. 447-449, vol. 3, Macmillan Publishers Limted.

Yu, et al., "Polymer Photovoltaic Cells: Enhanced Efficiencies via a Network of Internal Donor-Acceptor Heterojunctions", Science, Dec. 15, 1995, pp. 1789-1791, vol. 270, Santa Barbara, California.

Park, et al., "Bulk heterojuncction solar cells with internal quantum efficiency approaching 100%", Nature Photonics, May 2009, pp. 297-302, vol. 3, Quebec City, Quebec, Canada.

Forrest, Stephen R., "The Limits to Organic Photovoltaic Cell Efficiency", MRS Bulletin, Jan. 2005, pp. 28-32, vol. 30.

Saito, et al., "Physical Properties of Carbon Nanotubes", 1998, pp. Title page to p. 12, Imperial College Press, London, UK.

Harris, P.J.F., "Carbon nanotube composites", International Materials Reviews, 2004, pp. 31-43, vol. 49, No. 1, Maney for the Institute of Materials, Minerals and Mining and ASM International.

Kong, et al., "Synthesis of individual single-walled carbon nanotubes on patterned silicon wafers", Nature, Oct. 29, 1998, pp. 878-881, vol. 395, Macmillian Publishers Ltd.

Rosenblatt, et al., "High performance electrolyte-gated carbon nanotube transistors", Nano Letters, 2002, pp. 1-12, Berkeley, California.

Takenobu, et al., "Stable and controlled amphoteric doping by encapsulation of organic molecules inside carbon nanotubes", Nature Materials, Oct. 2003, pp. 683-688, vol. 2, Nature Publishing Group.

Geng, et al., "Influence of Single-Walled Carbon Nanotubes Induced Crystallinity Enhancement and Morphology Change on Polymer Photovoltaic Devices", J. American Chemical Society, 2006, pp. 16827-16833, vol. 128, American Chemical Society.

Kim, et al., "A strong regioregularity effect in self-organizing conjugated polymer films and high-efficiency polythiophene: fullerence solar cells", Nature Materials, Mar. 2006, pp. 197-203, vol. 5, Nature Publishing Group.

Schuettfort, et al., "Observation of a Type II Heterojunction in a Highly Ordered Polymer—Carbon Nanotube Nanohybrid Structure", Nano Letters, Oct. 1, 2009, pp. 3871-3876, vol. 9, American Chemical Society.

Kanai, et al., "Role of Semiconducting and Metallic Tubes in P3HT/Carbon-Nanotube Photovoltaic Heterojunctions: Density Functional Theory Calculations", Nano Letters, Feb. 22, 2008, pp. 908-912, vol. 8, No. 3, American Chemical Society.

Shaw, et al., "Exciton Diffusion Measurements in Poly(3-hexylthiophene)", Advanced Materials, 2008, pp. 3516-3520, vol. 20, WILEY-VCH Verlag GmbH & Co. KGaA, Weinheim.

Brown, et al., "Effect of interchain interactions on the absorption and emission of poly(3-hexylthiophene)", Physical Review, 2003, pp. 064203-1 to 064203-16, B 67, The American Physical Society.

Li, et al. "Tuning Optical Properties and Enhancing Solid-State Emission of Poly(thiophene)s by Molecular Control a Postfunctionalization Approach", Macromolecules, 2002, pp. 6900-6906, vol. 35, American Chemical Society.

Kim, et al., "Ellicient Tandem Polymer Solar Cells Fabricated by All-Solution Processing", Science, Jul. 13, 2007, pp. 222-225, vol. 317, American Association for the Advancement of Science, Washington, DC.

Hata, et al., "Water-Assisted Highly Efficient Synthesis of Impurity-Free Single-Walled Carbon Nanotubes", Science, Nov. 19, 2004, pp. 1362-1364, vol. 306, American Association for the Advancement of Science, Washington, DC.

Zhang, et al., "Ultra-high-yield growth of vertical single-walled carbon nanotubes: Hidden roles of hydrogen and oxygen", PNAS, Nov. 8, 2005, pp. 16141-16145, vol. 102, No. 45, The National Academy of Sciences of the USA.

Huang, et al., "Detailed analysis of bathocuproine layer for organic solar cells based on copper phthalocyanine and C60", Journal of Applied Physics, 2009, pp. 073105-1 to 073105-5, vol. 105, American Institute of Physics.

Kymakis, et al., "Carbon nanotube doping of P3HT : PCBM photovoltaic devices", Journal of Physics D: Applied Physics, 2008, pp. 165110-1 to 165110-5, vol. 41, IOP Publishing Ltd., UK.

Nelson, et al., "Charge Recombination in Polymer/Fullerence Photovoltaic Devices", 3rd World Conference on Photovoltaic Energy Conversion (Osaka, Japan), May 11-18, 2003, pp. 2686-2689, Imperial College, London, UK.

Lioudakis, et al., "Ultrafast Dynamics of Localized and Delocalized Polaron Transitions in P3HT/PCBM Blend Materials: The Effects of PCBM Concentration", Nanoscale Res Lett, 2009, pp. 1475-1480, vol. 4.

Voigt, et al., "Dynamical optical investigation of polymer/fullerence composite solar cells", Physica Status Solidi (b), 2008, pp. 714-719, vol. 245, No. 4, WILEY-VCH Verlag GmbH & KGaA, Weinheim.

International Preliminary Report on Patentability (date of mailing Jan. 24, 2013).

* cited by examiner

CARBON NANOTUBE HYBRID PHOTOVOLTAICS

CROSS REFERENCE TO RELATED APPLICATIONS

This application claims priority to U.S. Provisional Patent Application Ser. No. 61/363,103, filed Jul. 9, 2010, the disclosure which is incorporated herein by reference.

BACKGROUND OF THE INVENTION

The present disclosure relates to systems and methods of efficient photocurrent generation and through hole transfer at individual metallic and semiconducting single-walled carbon nanotube/poly [3-hexylthiophene-2,5-diyl] junctions, among other things.

The following description of the background of the invention is provided to aid in understanding the invention, but is not admitted to describe or constitute prior art to the invention. The contents of the articles, patents, and patent applications, and all other documents and electronically available information mentioned or cited in this application, are hereby incorporated by reference in their entirety to the same extent as if each individual publication was specifically and individually indicated to be incorporated by reference, including any references cited in the articles, patents, patent applications and documents cited herein. Applicants reserve the right to physically incorporate into this application any and all materials and information from any such articles, patents, patent applications, or other documents.

Photovoltaic devices based on organic polymers and small molecules have great potential for low cost and scalable renewable energy harvesting. S. Sun, N. S. Sariciftci, "Organic Photovoltaics: Mechanisms, Materials and Devices" (CRC Press, Florida, 2005). A generic organic photovoltaic device consists of a donor-acceptor system, enabling exciton dissociation and charge separation at the heterojunction. B. A. Gregg, M. C. Hanna, "Comparing organic to inorganic photovoltaic cells: Theory, experiment, and simulation," J. of Appl. Phys. 93, 3605-3614 (2003); P. Peumans, A. Yakimov, S. R. Forrest, "Small molecular weight organic thin-film photodetectors and solar cells," J. of Appl. Phys. 93, 3693-3723 (2003); and P. W. M. Blom, V. D. Mihailetchi, L. J. A. Koster, D. E. Markov, "Device physics of polymer: Fullerene bulk heterojunction solar cells," Adv. Mater. 19, 1551-1566 (2007). Thus far, the most successful organic photovoltaic is in the form of polymer/fullerene bulk heterojunctions with up to ~7% power conversion efficiency. V. Shrotriya, "Organic photovoltaics: Polymer power," Nat. Photon. 3, 447-449 (2009). The interpenetrated donor-acceptor network within a bulk heterojunction photovoltaic maximizes the exciton dissociation efficiency, but it also slows down the charge extraction. G. Yu, J. Gao, J. C. Hummelen, F. Wudl, A. J. Heeger, "Polymer photovoltaic cells: enhanced efficiencies via a network of internal donor-acceptor heterojunctions," Science 270, 1789-1791 (1995); and S. H. Park et al., "Bulk heterojunction solar cells with internal quantum efficiency approaching 100%," Nat Photon 3, 297-302 (2009). As a result, the subsequent charge recombination and the low carrier mobility of polymer limit overall power conversion efficiency below the minimum required for commercialization. V. Shrotriya, "Organic photovoltaics: Polymer power," Nat. Photon. 3, 447-449 (2009); and S. R. Forrest, "The limits to organic photovoltaic cell efficiency", MRS Bulletin 30, 28-32 (2005). A potential solution is to adopt high mobility conducting network for fast carrier extraction. Single-walled carbon nanotubes (SWNTs) are among the top candidates; they are one-dimensional conductors with highly conjugated electronic states and orders of magnitude higher carrier mobilities than conducting polymers. Saito R. et al., "Physical properties of carbon nanotubes" (Imperial College Press, London, 1998); P. J. F. Harris, "Carbon nanotube composites," Int. Mater. Rev. 49, 31 (2004); J. Kong, H. T. Soh, A. M. Cassell, C. F. Quate, H. Dai, "Synthesis of individual singlewalled carbon nanotubes on patterned silicon wafers," Nature 395, 878 (1998); S. Rosenblatt, Y. Yaish, J. Park, J. Gore, V. Sazonova, P. McEuen, "High performance electrolyte gated carbon nanotube transistors," Nano Lett. 2, 869-872 (2002); and T. Takenobu et al., "Stable and controlled amphoteric doping by encapsulation of organic molecules inside carbon nanotubes," Nature Materials 2, 683-688 (2003).

To this end, hybrid organic photovoltaic devices based on polymers and SWNTs have been proposed and investigated as model systems. In most of these devices, excitons are presumably generated and broken up at the heterojunction with the SWNTs believed to function as the electron acceptor. However, contrary to expectation similarly constructed bulk heterojunction photovoltaic systems have thus far demonstrated poor performance. Density functional theory calculations on singular molecules suggest that the presence of metallic (m-) SWNTs may be at least partially blamed for such poor performance. One theory is that instead of breaking up excitons, the m-SWNTs within the active blend act as a recombination center for electrons and holes. J. Geng, T. Zeng, "Influence of Single-Walled Carbon Nanotubes Induced Crystallinity Enhancement and Morphology Change on Polymer Photovoltaic Devices", J. Am. Chem. Soc. 128, 16827 (2006); Y. Kim et al., "A strong regioregularity effect in self-organizing conjugated polymer films and high-efficiency polythiophene:fullerene solar cells". Nature Materials 5, 197-203 (2006) and T. Schuettfort, A. Nish, R. J. Nicholas, "Observation of a Type II heterojunction in a highly ordered polymer-carbon nanotube nanohybrid structure", Nano Lett. 9, 3871-3876 (2009). Y. Kanai, J. C. Grossman, "Role of semiconducting and metallic tubes in P3HT/carbon-nanotube photovoltaic heterojunctions: density functional theory calculations". Nano lett. 8, 908-912 (2008).

Thus, there is a need for improved devices and methods and the present invention is aimed at one or more of the problems set forth above, among other things.

SUMMARY OF THE INVENTION

Embodiments of the invention are directed to methods of modifying a tubular fullerene, and in particular, an SWNT, as well as the use of such modified tubular fullerene, and in particular an SWNT, in devices or systems for light conversion and current generation.

Some embodiments of the invention are directed to a photovoltaic device which includes a carbon nanotube and a layer of polymer in contact with at least a portion of the carbon nanotube that forms a heterojunction with the carbon nanotube. The carbon nanotube may therefore act, or be modified to act, as either a hole acceptor dissociating photogenerated excitons or electron acceptor, depending on the polymer selected, among other things. In some embodiments the polyer may be a regioregular polymer.

Some embodiments of the invention are directed to a photovoltaic device as described above, wherein the relative charge transfer to the carbon nanotube is facilitated by a built-in field created by regioregular polymer doping the carbon nanotube.

Some embodiments of the invention are directed to a photovoltaic device as described above, wherein the regioregular polymer is poly [3-hexylthiophene-2,5-diyl] ("P3HT") or derivatives thereof.

Some embodiments of the invention are directed to a photovoltaic device as described above, further include a first electrode and a second electrode. The first electrode may be composed of a metal, such as palladium (Pd) or aluminum (Al), deposited in contact with the carbon nanotube. The second electrode may be composed of a transparent conductor, such as indium tin oxide. In some embodiments, a layer of $SiO_2$ may be deposited over the first electrode.

The carbon nanotube of the aforementioned device may be a single-walled carbon nanotube or multi-walled carbon nanotube.

Some embodiments of the invention are directed to a method of producing a photovoltaic device having a carbon nanotube and a layer of regioregular polymer which forms a heterojunction with the carbon nanotube, which includes the steps of: synthesizing a carbon nanotube on a quartz substrate using chemical vapor deposition; spin coating a layer of regioregular polymer over the carbon nanotube forming the heterojunction such that the carbon nanotube acts a charge acceptor; forming a first contact; depositing a layer of $SiO_2$ over the first contact; and forming a second contact using RF sputtering. As mentioned above, the carbon nanotube of may be a single-walled carbon nanotube or multi-walled carbon nanotube.

Some embodiments of the invention are directed to a device for photocurrent generation, which includes a substrate composed substantially of an insulator material, a carbon nanotube supported by the insulator substrate, a first electrode in contact with the carbon nanotube, a second electrode in electrical communication with the carbon nanotube and a layer composed substantially of regioregular polymer disposed on the carbon nanotube. The layer may form a heterojunction with the carbon nanotube. Depending upon the polymer selected the carbon nanotube may function as a hole acceptor or charge acceptor, among other things.

Some embodiments of the invention are directed to a device as described above, wherein the second electrode is fabricated of a transparent conductor material.

In some embodiments of the invention the carbon nanotube may be single-walled or multi-walled, or combination thereof. The invention may further include a plurality of carbon nanotubes in any arrangement, such as an array or lattice, formed according to any embodiment described herein.

Some embodiments of the invention are directed to a device as described above, wherein the first electrode is a metal, which may be partially or wholly covered by any insulating material.

Some embodiments of the invention are directed to a device as described above, wherein the regioregular polymer is a regioregular polythiophene. Alternatively, the regioregular polymer may be poly [3-hexylthiophene-2,5-diyl] or derivatives thereof.

Some embodiments of the invention are directed to a device as described above, wherein the second electrode is supported by the substrate.

Some embodiments of the invention are directed to systems and devices, and methods of producing a SWNT/P3HT heterojunction containing a single SWNT. While not wishing to be limited to any single theory, it is understood that P3HT p-dopes the SWNTs, and both s-SWNT and m-SWNT act as either an efficient hole acceptor instead of an electron acceptor. Furthermore, some embodiments of the invention are directed to large area SWNT/P3HT hybrid photovoltaic devices. Such devices have been found to exhibit greater than about 90% effective external quantum efficiency, promising remarkable potential for solar energy harvesting, among other things.

DESCRIPTION OF THE DRAWINGS

FIG. 1A is a schematic represents the device layout for studying photoinduced charge transfer between P3HT and individual s-SWNT (m-SWNT). Excitons generated in the polymer diffuse to the heterojunction where they subsequently dissociate with the photogenerated hole (as shown by the letter "h") going to the SWNT and the electron (as shown by the letter "e") going to the ITO contact via the polymer.

FIG. 1B is a graph showing the change in photocurrent for an Al/P3HT reference device (device area 1000 um$^2$) ("black" line), single s-SWNT/P3HT devices ("red" line), m-SWNT/P3HT ("green" line) and (6 SWNTs) ensemble SWNT/P3HT ("blue" line) under 1275 mW/cm$^2$, 532 nm CW laser illumination. The current is collected from ITO keeping the Al electrode at zero bias. Inset shows an Atomic Force Microscopy (AFM) image of a single SWNT bridging the metal contacts.

FIG. 1C is a graph showing the photocurrent of reference metal/P3HT ("black" squares), reference metal/oxide/P3HT (black triangles), single s-SWNT/P3HT ("red" squares), single m-SWNT/P3HT ("green" squares) and ensemble SWNT/P3HT ("blue" square) devices. Filled and empty symbols show Al and Pd electrodes respectively.

FIG. 1D is a graph showing current-voltage characteristics of ensemble (6 SWNTs) Al/SWNT/P3HT/ITO device under 532 nm CW laser illumination. The device is also biased as discussed above. Power density of the laser is calculated considering a circular laser illumination area with 50 μm diameter.

FIG. 2A is a graph of the G vs. $V_g$ of a Pd/s-SWNT/Pd device without P3HT ("black" line) and with P3HT ("red" line) spin coated on the SWNT. The inset shows the G vs. $V_g$ of a Pd/m-SWNT/Pd device without P3HT ("black" line) and with P3HT ("red" line) spin coated on the SWNT.

FIG. 2B is a graph of net photocurrent vs. Vg of individual s-SWNT (m-SWNT)/P3HT devices (zero $V_{bias}$) under 30.3 W/cm$^2$ 532 nm CW laser illumination. The current is collected from the Pd source electrode keeping ITO at zero bias and floating Pd drain electrode. For both s-SWNT and m-SWNT the direction of photocurrent changed sign from positive to negative when $V_g$ is increased in the positive direction. Positive (negative) photocurrent indicates hole (electron) transfer from P3HT to the SWNTs.

DETAILED DESCRIPTION OF THE INVENTION

The following description contains illustrations of devices, systems and methods according to the invention for purposes of promoting an understanding of such embodiments the invention, among other things. It should be understood that the scope of the invention is not limited by these embodiments. Alterations and modifications of the features of the invention, as well as additional applications of its principles in other forms or embodiments, such as those which would normally occur to one skilled in the relevant art having possession of this disclosure, are to be considered within the scope of the invention as claimed.

Figure 1A:
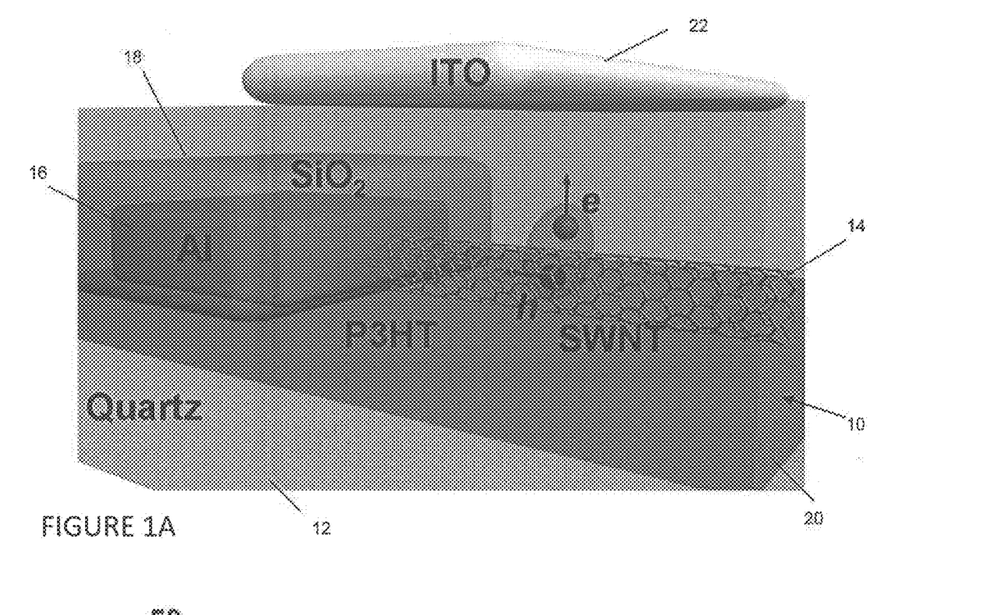
FIGS. 1A, 1B, 1C, and 1D are directed to an exemplary embodiment of the invention, illustrating photocurrent generation at an individual s-SWNT (m-SWNT) and P3HT junction.

FIG. 1A illustrates an exemplary embodiment of a device constructed according to the invention which is generally referred to by the reference number 10. In this embodiment, device 10 includes a single junction SWNT/P3HT bilayer photovoltaic formed on an insulating substrate 12, which may be quartz or another material that preferably facilitates the reduction or elimination of photo-gating effects. Device 10 further includes a plurality of SWNTs forming a lattice 14. SWNTs 14 may be synthesized by any suitable methods such as chemical vapor deposition (CVD) method with evaporated Fe (3 Å) as the catalysts, while the density of SWNTs 14 is controlled at least in part by the size of catalyst pad/electrode 16. P. Shaw, A. Ruseckas, I. D. W. Samuel, "Exciton Diffusion Measurements in Poly(3-hexylthiophene)." Adv. Mater. 20, 3516-3520 (2008). Catalyst pad/electrode 16 may be constructed of any suitable conductor, such as a metal like palladium. In this embodiment, catalyst pad/electrode 16 is constructed of aluminum with a layer of insulating material deposited thereon to prevent leakage, among other things. In this embodiment, a layer of silicon dioxide (i.e., about 200 nm of $SiO_2$) is deposited over the electrode area formed by catalyst pad/electrode 16.

Figure 1B:
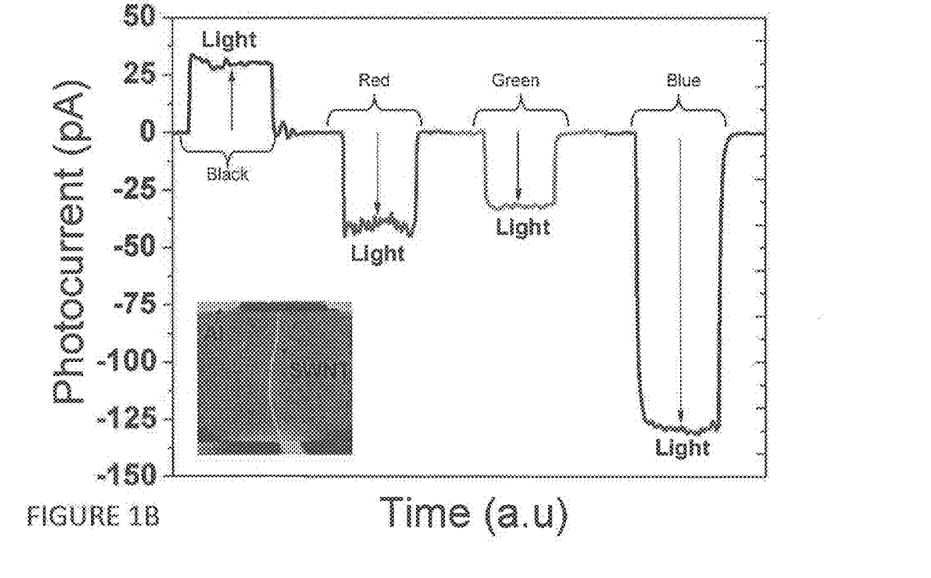

It should be noted that atomic force microscopy is used to identify devices containing only single SWNT (as shown in FIG. 1B inset), and solution-gate electrical transport studies are used to identify the semiconducting or metallic nature of SWNT. P. J. Brown et al., Effect of interchain interactions on the absorption and emission of poly(3-hexylthiophene). Phys. Rev. B 67, 064203 (2003).

In this embodiment, a layer 20 of conducting polymer is disposed over the lattice 14 of SWNTs to form a heterojunction between layer 20 and lattice 14. Layer 20 of conducting polymer may be disposed over lattice 14 through any suitable method, such as spin-coating.

The polymer layer 20 may consist of one or combinations of any conducting or semiconducting polymers, such as for example, a polyacetylene, a polyphenylene, a polythiophene, a polyaniline, a polypyrrole, or a polyphenylene vinylene. In particular, the conducting polymer layer may consist of, for example, a polythiophene, optionally substituted at the 3-position, at the 4-position, or both. The conducting polymer layer may also include, for example, a polythiophene with alkyl, aryl, alkoxy, aryloxy, ether, polyether, or heteroatomic substituents. In particular, the conducting polymer can be a regioregular polythiophene, and more particularly, the conducting polymer can be a regioregular poly(3-alkylthiophene) or poly [3-hexylthiophene-2,5-diyl]. The amount of regioregularity can be, for example, at least about 95% or at least about 98%. The conducting polymer can be a copolymer including, for example, a random, gradient, or block copolymer. The conducting polymer can have a number average molecular weight of about 100,000 or less, or a number average molecular weight of about 50,000 or less, or alternatively, a number average molecular weight of about 25,000 or less, or alternatively, a number average molecular weight of about 10,000 or less, or alternatively, a number average molecular weight of about 5,000 or less. It should be understood that a variety of polymerization methods can be carried out according to some embodiments of the invention. The polymer layer may also include one or more conducting or semiconducting polymers, such as for example, pyrolyzed polyacrylonitriles, pyrolyzed polyesters, polyaromatic polymers, other polythiophenes or regioregular poly(thiophenes) (for example, poly[5,5'-bis(3-dodecyl-2-thienyl)-2,2'-bithiophene] or PQT-12), poly(fluorenes) and polymers having highly conjugated systems; precursors of such polymers; aromatic compounds, such as solubilized anthracene; and mixtures and/or copolymers thereof. Semiconducting materials can be included in exemplary blends of conducting, semiconducting and insulating material in amounts in ranging from about 0.1 to about 99.9 percent by weight of the blend, which may then be used in layer 20.

In this embodiment, layer 20 is composed substantially of P3HT and has a thickness of about 65 nm. A contact 22 is formed of a transparent conductor material on an exterior surface of device 10 thereby forming an operative junction between the electrode, conducting polymer and the transparent conductor, among other things. In this embodiment, contact 22 is fabricated of indium tin oxide ("ITO") through any suitable technique, such as RF sputtering deposition, thereby forming a junction particularly composed of Al/P3HT/ITO in this embodiment.

Studies and analysis of the characteristics of device 10 are described herein below. Photo-induced charge transfer was studied on uniquely identified individual semiconducting-SWNT/P3HT (s-SWNT/P3HT) junction and metallic-SWNT/P3HT (m-SWNT/P3HT) junction, with nanotube length L of about 8 μm and Al metal as nanotube contact. The photocurrent from the ITO side (FIG. 1A) was collected, and measurements were carried out under monochromatic (about 532 nm) continuous-wave (CW) illumination. Under short-circuit condition, s-SWNT/P3HT junction (FIG. 1B, identified as "red") and m-SWNT/P3HT (FIG. 1B, identified as "green") junction generate about −42 pA and about −31 pA of photocurrent under illumination intensity of 1275 mW/cm$^2$, respectively. It should be noted that the sign of photocurrent is negative, indicating hole extraction for both s-SWNT and m-SWNT from layer 20 of P3HT, among other things, as shown in FIG. 1A.

As a comparison, the reference Al/P3HT/ITO junction (FIG. 1B, identified as "black") generates about 30 pA of photocurrent in the opposite direction. The positive photocurrent corresponds to electron transfer into Al, agreeing with the lower work function of Al (4.3 eV) compared to ITO (4.7 eV). Interestingly, this reference photocurrent, generated from a much larger Al electrode area (~1000 μm$^2$), is on the same order of photocurrent generated from a single SWNT. These data suggest a different charger transfer mechanism than previously assumed, among other things. Both s-SWNT and m-SWNT function as efficient hole acceptors dissociating excitons generated at the SWNT/P3HT junction. Furthermore, a lattice of six-SWNTs (ensemble of m-SWNTs and s-SWNTs) device shows about −130 pA of photocurrent (FIG. 1B, identified as "blue"). The scalable increase of current generation compared to a single SWNT junction once again proves that both m-SWNT and s-SWNT are working collectively as hole acceptors, among other things.

Figure 1C:
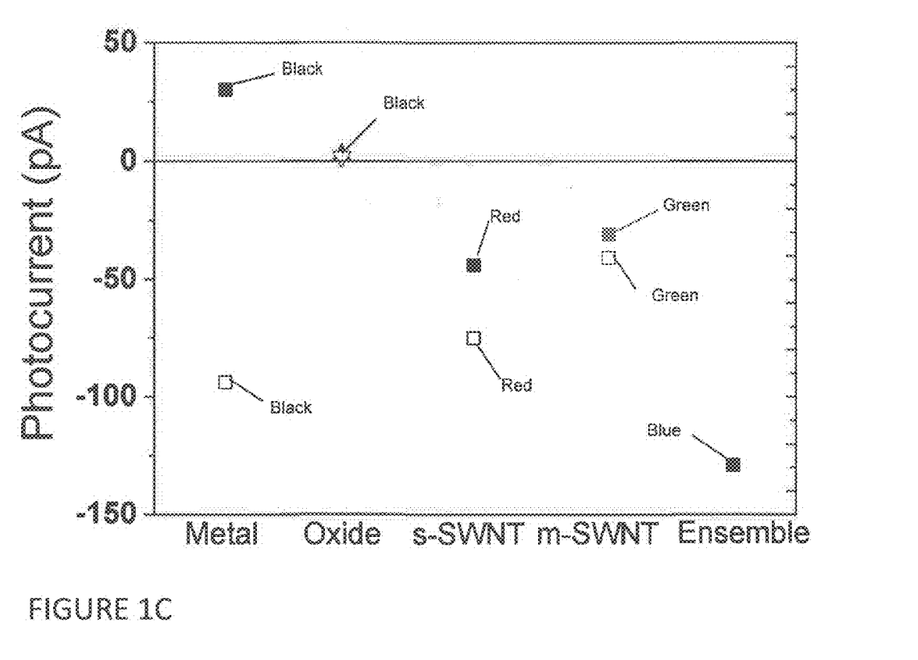

The effect of nanotube contact metal on charge transfer by studying variations of devices constructed similarly to device 10. For example, a device was constructed with a palladium (Pd) catalyst pad/electrode instead of Al. As shown in FIG. 1C, Pd contacted individual s-SWNT/P3HT junction (red open square) and m-SWNT/P3HT junction (green open square) generate about −75 pA and about −41 pA of photocurrent, respectively. It should be noted that the sign of photocurrent for Pd contacted s-SWNT and m-SWNT devices remains unchanged compared to Al contacted devices (filled squares). For the reference device with a Pd/P3HT/ITO junction with Pd electrode area of ~160 μm$^2$, about −94 pA photocurrent (black open-square) was measured. The sign of the photocurrent corresponds to hole transfer into Pd, agreeing with the higher work function of Pd (5.1 eV) compared to ITO. These results show that the reference metal/P3HT/ITO junctions behave distinctly different than metal/SWNT/P3HT/ITO junctions. For metal/P3HT/ITO junctions, as expected, photocurrent directions are dictated by work function difference between metal and ITO. Significantly, for both m-SWNT/P3HT and s-SWNT/P3HT junctions, hole transfer from P3HT to SWNTs is independent of the contact metal work function, and is solely determined by the heterojunction. Moreover, controlled devices with identical design except SWNTs, i.e. Al/SiO2/P3HT/ITO (black filled-triangle) and Pd/SiO2/P3HT/ITO (black open-triangle), show negligible photocurrent (FIG. 1C, oxide). These results again confirm that the photocurrent is generated at the SWNT/P3HT heterojunction. Last, Pd contacted SWNT/P3HT devices show larger photocurrent compared to Al contacted devices. Thus, the higher work function Pd is preferred over Al as a contact metal to SWNT for hole extraction from a SWNT/P3HT heterojunction.

Figure 1D:
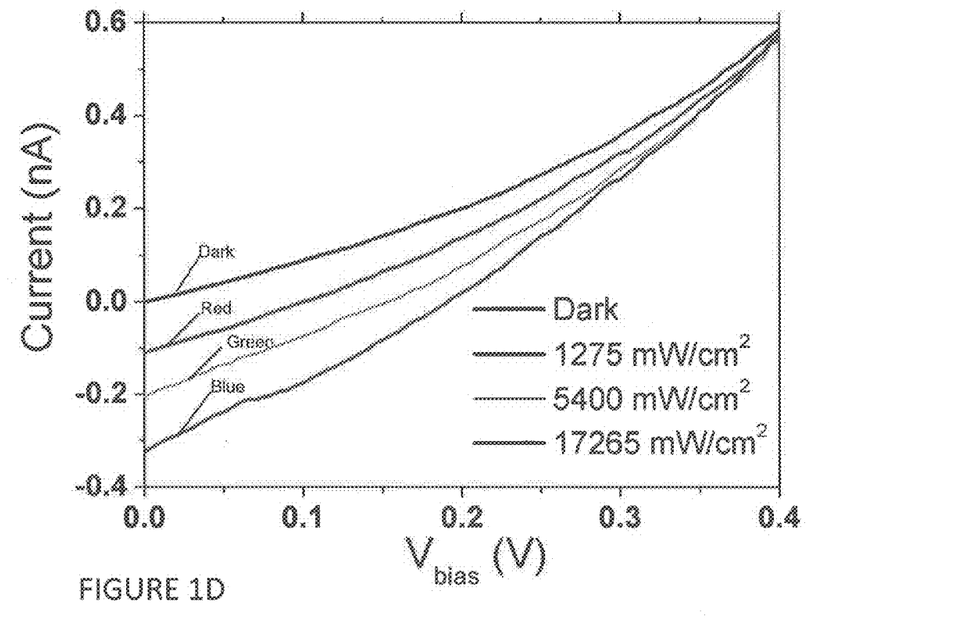
Figure 2A:
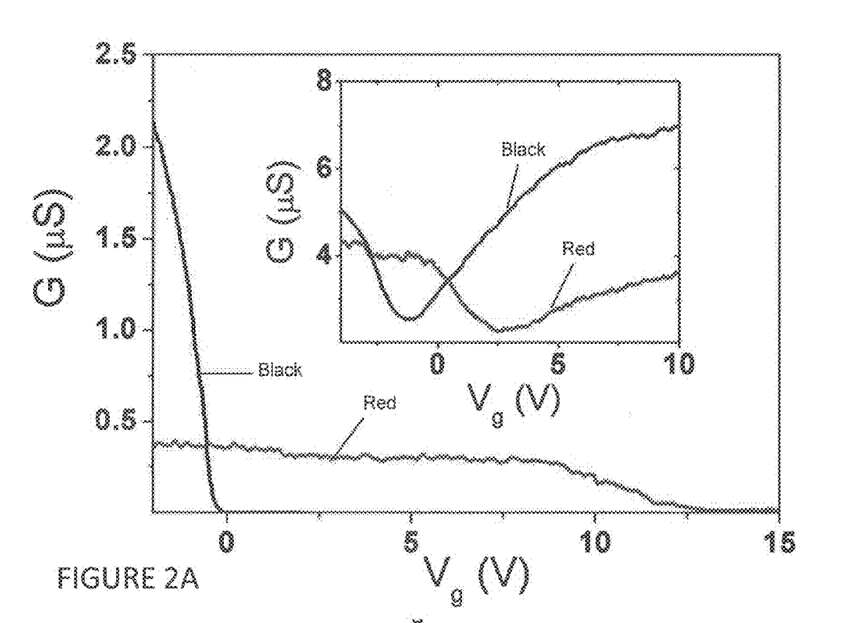
FIGS. 2A and 2B are directed to an exemplary embodiment of the invention, illustrating P3HT induced P-doping effect on s-SWNT (m-SWNT).
Figure 2B:
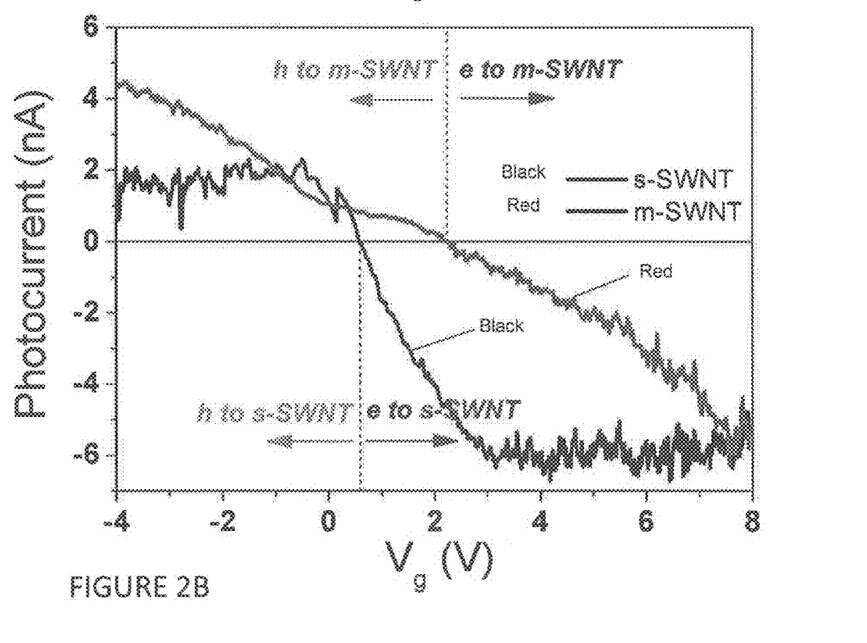

Current-voltage (I-V) behaviour under dark and at varying optical illuminations (CW at 532 nm) is also characterized, and measurements taken on the six-SWNTs/P3HT junction is shown in FIG. 1D. Forward direction rectifying I-V obtained under dark condition suggests the formation of heterojunction with higher work function at the SWNTs side (FIG. 2B). Photocurrent increases in the fourth quadrant with increasing light intensity (FIG. 1D). Also, an open circuit voltage ($V_{oc}$) up to 0.2 V is measured under 17.265 W/cm$^2$ illumination. Furthermore, I-V curves under dark and light conditions merge at ~0.4 V, at which voltage zero photocurrent is generated. It should be noted that at this bias the energy band can be assumed flat, yielding an estimation of the built-in voltage as ~0.4 V. This built-in voltage is sufficient to break up the excitons at the SWNT/P3HT heterojunction and generate photocurrent.

To investigate the physical mechanism governing the unexpected hole transfer from P3HT to the SWNTs, a gate electrode was introduced to electrostatically vary the Fermi level and doping of SWNTs. Individual SWNTs were grown on degenerate doped Si wafer with 300 nm of SiO$_2$, and Pd source-drain electrodes were deposited defining 8 μm of SWNT channel length. A 200 nm SiO$_2$ was used as a dielectric mask on the electrodes exposing only the SWNT area. First, conductance (G) vs. silicon back gate voltage ($V_g$) measurements were carried out before and after the spin-coating of 65 nm film of P3HT. FIG. 2A shows the G-$V_g$ plot of a single s-SWNT before (black line) and after (red line) contacting with P3HT. Interestingly, the transfer curve shifts to positive $V_g$ value by 13.1 V after contacting with P3HT. Similar shift (3.7 V) is also observed for single m-SWNT device (FIG. 2A, inset) after P3HT coating. The large positive shifts of transfer curves reveal that both s-SWNT and m-SWNT are heavily p-doped. The heavy p-doping of SWNTs agrees with the observed hole extraction from the SWNT/P3HT junction. Reports in literature have also shown that organic and oganometallic molecules can be used to selectively p-(n-)dope SWNTs but hitherto unobserved in SWNT/P3HT interfaces. Y. Lu, G. Vamvounis, S. Holdcroft, "Tuning optical properties and enhancing solid-state emission of poly(thiothene)s by molecular control: A postfunctionalization approach," Macromolecules 35, 6900-6906 (2002); and J. Y. Kim et al., "Efficient Tandem Polymer Solar Cells Fabricated by All-Solution Processing" Science 317, 222-225 (2007).

While not intending to be limited to any specific theory, results from above electrical transport measurements suggest that hole extraction from SWNT/P3HT junction is closely related to the doping of SWNTs. Thus, the photocurrent dependence on doping was measured directly by tuning SWNTs' Fermi level through electrostatic gating using the silicon back gate. Current was collected from the Pd source electrode of the SWNTs, while the ITO electrode is kept at zero bias and floating the Pd drain. Interestingly, as $V_g$ is swept from −4 V to 8 V, photocurrent collected from s-SWNT/P3HT junction changes sign, with zero photocurrent seen at ~0.6 V (FIG. 2B, black curve). Furthermore, the m-SWNT/P3HT junction also shows a similar photocurrent sign flip with zero photocurrent seen at ~2.5 V (FIG. 2B, red curve). Based on our measurement scheme, positive (negative) photocurrent indicates hole (electron) transfer from P3HT to the s-SWNT and m-SWNT. Therefore, both s-SWNT and m-SWNT function as hole acceptors from P3HT at zero or negative gate voltage. However, as $V_g$ increases to higher positive value, electrostatically induced n-doping overcomes the P3HT p-doping, and both s-SWNT and m-SWNT function as electron acceptors.

The above electrical transport measurements, and in particular, the gate-dependent photocurrent measurements provide information on the photocurrent generation mechanism of these embodiment of the invention. Exciton dissociation and charge transfer between P3HT and SWNT depend on the relative Fermi level of the SWNT with respect to P3HT. Heavy p-doping of both m-SWNT and s-SWNT by P3HT coating results in lowering of nanotube Fermi level. A built-in voltage is developed across SWNT/P3HT junction with nanotube at lower potential, resulting in exciton dissociation and hole transfer into SWNTs. Magnitude of the built-in voltage is measured to be ~0.4 V by the flat-band voltage shown in FIG. 1D. This built-in voltage shows close agreement to the difference between the P3HT Fermi level (4.4 eV) and the ionization potential of the SWNT (4.7 eV), which can be approximated to the Fermi level of a heavily p-doped SWNTs. Since the exciton binding energy of P3HT is approximately 0.3 eV, the above built-in voltage would be adequate for exciton dissociation and photocurrent generation.

The physical insight gained on individual SWNT/P3HT junctions confirm that both m-SWNT and s-SWNT facilitate efficient exciton dissociation at the heterojunctions, and they both function as hole acceptors, among other things. This result has significant implication for a new paradigm of SWNT based hybrid photovoltaic devices. For example, since both s-SWNT and m-SWNT transfer holes from P3HT, the need to selectively omit m-SWNTs becomes unnecessary, reducing processing cost and complexity. To gauge the feasibility and measure the fundamental limits of energy conversion of this approach, a photovoltaic device such as device 10 with a large area SWNT/P3HT bilayer was fabricated with measured.

Figure 3A:
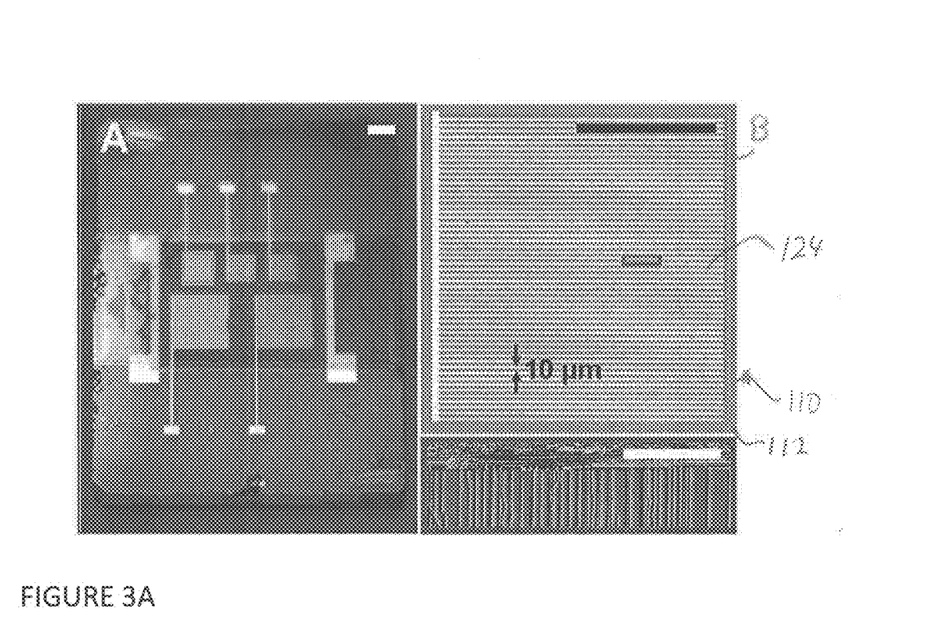
FIG. 3A is an optical image of another exemplary embodiment of the invention, illustrating relatively large area Pd/SWNT/P3HT/ITO devices on quartz. Scale bar is 1 mm. Box B shows a magnified image of the 1 mm$^2$ device with a 10 μm channel length. Scale bar is 0.5 mm. Box A shows an AFM micrograph of SWNTs grown aligned of the SWNTs. Scale bar is 10 μm.

As shown in FIG. 3A, a photovoltaic device 110 which includes a monolayer of horizontally aligned SWNTs array (~1 tube/μm) 124, containing one or more SWNTs fabricated as in device 10, grown on quartz substrates 112. It should be understood that other configurations and arrangements may be utilized in accordance with the invention One or more Pd (or Al) finger electrodes contact each of the SWNTs. A P3HT layer of 65 nm thickness is spin coated onto SWNTs as a light absorption layer, and ITO is used as the transparent top electrode. In this embodiment, sizes of the photovoltaic devices may be up to about 4 mm$^2$, and SWNT channel lengths between the finger electrodes are designed to be 3, 5 or 10 μm in this embodiment, but may vary in other embodiments.

Figure 3B:
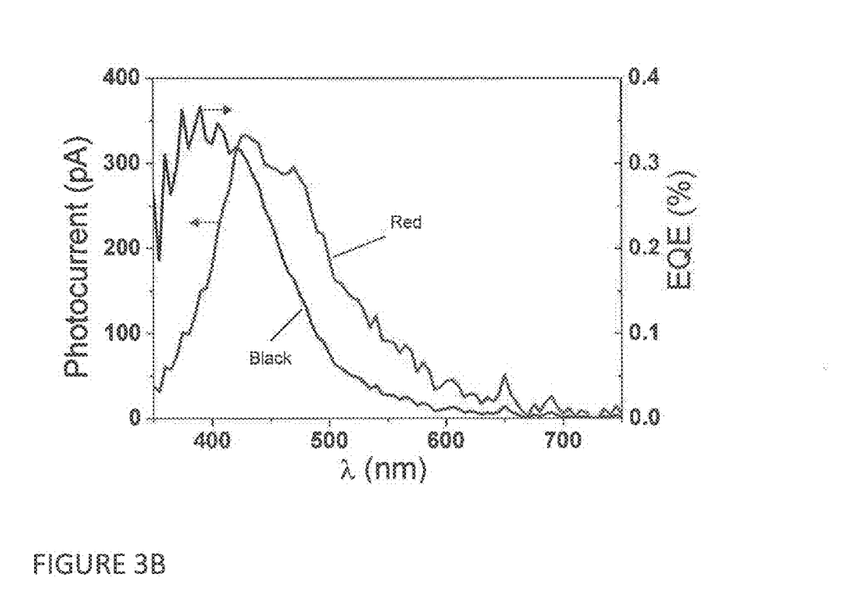
FIG. 3B is a graph of the external quantum efficiency (EQE) ("black" line) and short circuit photocurrent ("red" line) of a 1 mm$^2$ P3HT/SWNT photovoltaic device consisting of 3 μm SWNT channels.

To investigate the fundamental limit of photon to electron conversion efficiency for the aforementioned devices, wavelength dependent photocurrent measurements were carried out. FIG. 3B shows results obtained from a 1 mm$^2$ SWNT/P3HT hybrid photovoltaic device with 3 μm SWNT channel length. Larger photocurrent is obtained at photon wavelength 350-600 nm, suggesting that photocurrent generation is mainly due to light absorption in the P3HT (FIG. 3B, red curve). The external quantum efficiency (EQE), calculated by taking the ratio between the number of extracted free charges to the number of incident photons at each wavelength, shows a maximum of 0.37% at 390 nm (FIG. 3B, black curve). The low EQE is expected since exciton dissociation only occur though a single monolayer of SWNTs. Given the small exciton diffusion length in P3HT, $\Lambda_E$~8.5±0.7 nm, majority of photo-generated excitons recombine before reaching the SWNT/P3HT heterojunction.

Figure 3C:
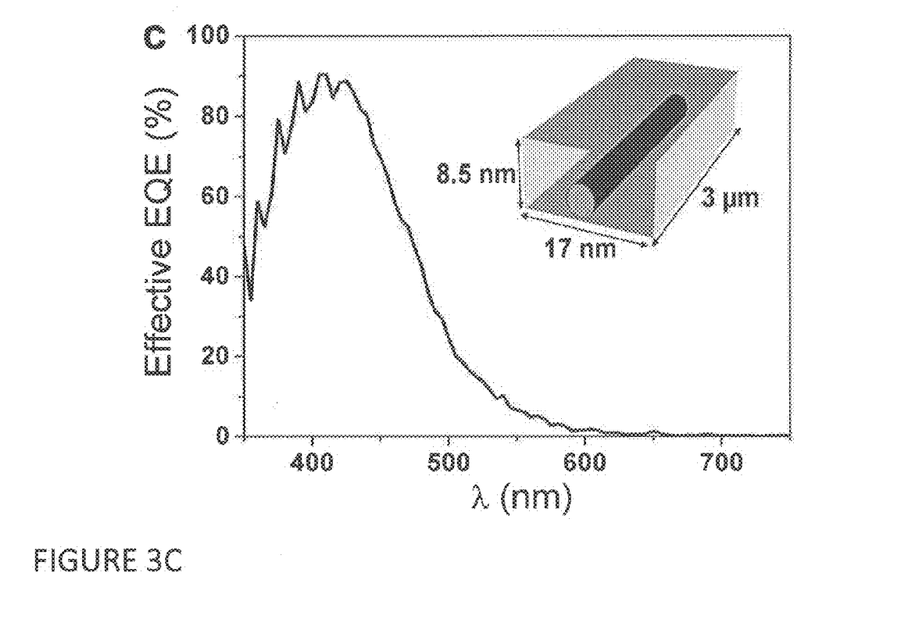
FIG. 3C is a graph of the estimated effective external quantum efficiency (Effective EQE) from a 3 μm channel device taking the ratio of extracted electrons to photons incident at an effective volume near the heterojunction (Inset).

To gain fundamental insight of intrinsic losses, the effective external quantum efficiency was calculated by considering the effective volume of photon absorption/dissociation near the SWNT/P3HT junctions. Since the SWNTs are geometrically aligned, the effective volume of each heterojunction can be estimated as a rectangular box having a width of 17 nm (twice of $\Lambda_E$ of P3HT), length of 3 μm (SWNT length), and height of the 8.5 nm ($\Lambda_E$) (FIG. 3C, inset). Therefore, the total effective volume is found as 36.4 μm$^3$ by scaling to the approximate number of SWNT within device area. The effective external quantum efficiency is obtained by taking ratio of electrons generated to number of photons incident within the effective device volume; calculated using the absorption coefficient of P3HT, optical loss through the top ITO and zero reflection after the SWNT/P3HT junction. Significantly, an effective EQE of 90±7.5% at 405 nm was estimated for the SWNT/P3HT prototype bilayer photovoltaic device (FIG. 3C). Furthermore, the effective EQE was found to be greater than 80% between 385 nm to 440 nm, demonstrating excellent intrinsic photon to electron conversion efficiency. The main error of our effective EQE calculation comes from $\Lambda_E$ estimation. From literature, the most accurate measurement of $\Lambda E$ is taken as 8.5±0.7 nm, yielding a maximum error of ±7.5% for the estimated effective EQE. Nevertheless, the extremely efficient photon harvesting capability promises remarkable potential for SWNTs' application for hybrid photovoltaics. We also noticed that the peak effective EQE was blue shifted with respect to the absorption spectrum of the P3HT film. As suggested by previous reports, molecular organization of P3HT strongly affects exciton energy thereby changing the absorbance peak explaining the above blue shift. P. J. Brown et al., "Effect of interchain interactions on the absorption and emission of poly (3-hexylthiophene)". *Phys. Rev. B* 67, 064203 (2003)

Figure 4A:
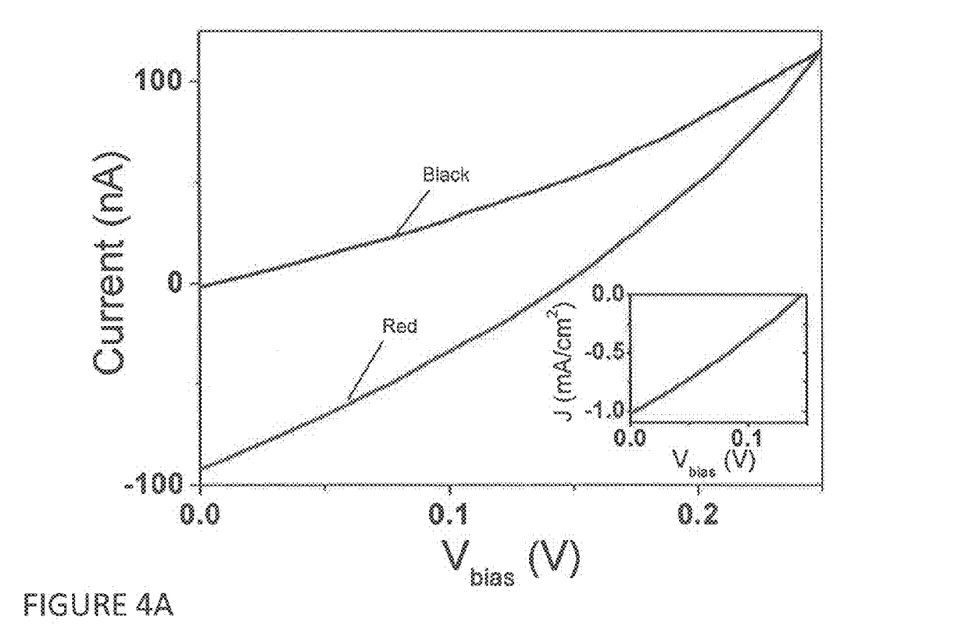
FIG. 4A is a graph of the current-voltage plot of the Pd/SWNT/P3HT/ITO under dark ("black" line) and AM1.5G illumination ("red" line). The inset shows the estimated current density vs. voltage plot.

To further infer the power conversion efficiency of the prototype SWNT/P3HT bilayer photovoltaics, I-V measurements were carried out under standard AM1.5G solar illumination (100 mW/cm$^2$). Approximately, 92 nA of short circuit current together with 0.15 V open circuit voltage was obtained (FIG. 4A, red curve) for a device with 10 μm SWNT channel length. Effective current density is calculated using the effective device area of 0.009 mm$^2$ (FIG. 4A, inset). Since SWNTs were geometrically aligned the product of twice the $\Lambda_E$ (8.5 nm) into channel length (10 μm) scaled by the approximate number of SWNTs within the active area provides the effective device area. A short circuit current density (Jsc) of 1.0 mA/cm$^2$ is obtained under 1-sun AM1.5G, which is only 10 times smaller than the highest reported P3HT/phenyl-C$_{61}$-butyric acid methyl ester (PCBM) photovoltaic, Y. Kim et al., "A strong regioregularity effect in self-organizing conjugated polymer films and high-efficiency polythiophene:fullerene solar cells", *Nature Materials* 5, 197-203 (2006). Considering that photocurrent is generated from a single monolayer of SWNTs, our prototype SWNT/P3HT hybrid device promises a remarkable potential for scaling and optimization. Using the $J_{sc}$ (1.0 mA/cm$^2$), $V_{oc}$ (0.15 V) and the fill factor (0.36), an optical to electrical power conversion efficiency (PCE) of 0.05% was estimated. Although limited by extrinsic factors, orders of magnitude improvement of PCE are expected by adopting multilayer SWNTs or using vertically aligned SWNT arrays, K. Hata, D. N. Futaba, K. Mizuno, T. Namai, M. Yumura, S. Iijima, "Water-assisted highly efficient synthesis of impurity-free single-walled carbon nanotubes," *Science* 306, 1362-1364 (2004); and G. Zhang, D. Mann, Li. Zhang, A. Javey, Y. Li, E. Yenilmez, Q. Wang, J. P. McVittie, Y. Nishi, J. Gibbons, H. Dai, "Ultrahigh-yield growth of vertical single-walled carbon nanotubes: Hidden roles of hydrogen and oxygen," *PNAS* 102, 16141-16145 (2005). Optimizations of Voc and fill factor can also be achieved by introducing electron (hole) blocking layers, J. Huang, J. S. Yu, H. Lin, "Detailed analysis of bathocuproine layer for organic solar cells based on copper phthalocyanine and C60", *J. Appl. Phys.* 105, 073105 (2009).

Figure 4B:
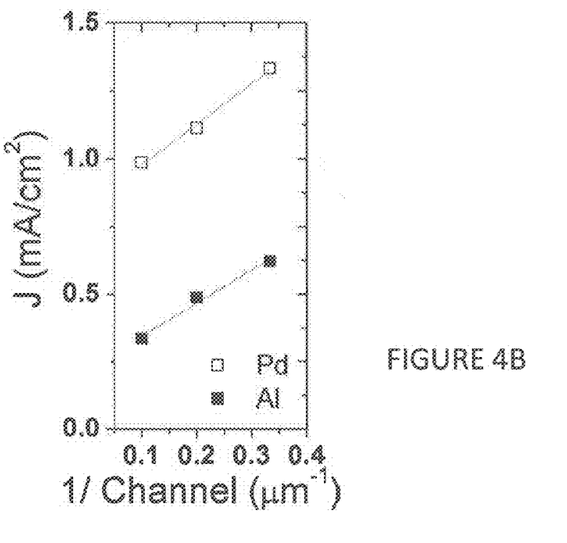
FIG. 4B is a graph of Photocurrent density vs. reciprocal SWNT channel length with Al (filled symbols) and Pd (empty symbols) electrodes. Al(Pd)/SWNT/P3HT/ITO large area (1 mm$^2$) devices were fabricated with 3, 5, 10 μm channel length and I-V measurements were carried out under AM1.5G illumination.

Next, the effect of the SWNT channel lengths on photocurrent generation in this embodiment was studied. FIG. 4B shows the $J_{sc}$ is inversely proportional to SWNT channel lengths for both Al (filled squares) and Pd (open squares) contacted devices. At room temperature and μm channel lengths, both m-SWNTs and s-SWNTs are diffusive conductors with conductance scales as 1/L. With SWNT/P3HT heterojunction arrays acting as power generators in parallel, photocurrent thus scales with SWNT channel conductance as 1/L.

Figure 4C:
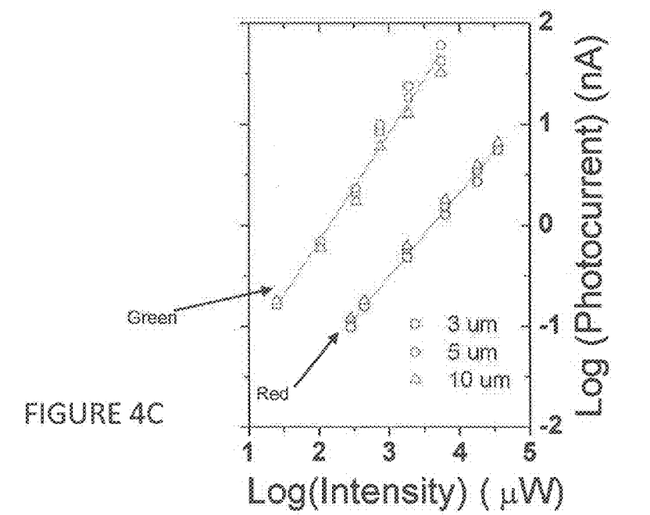
FIG. 4C is a graph of photocurrent vs. illumination intensity for Al/SWNT/P3HT/ITO device under 532 nm ("green" symbols) and 800 nm ("red" symbols) with 3 μm (square), 5 μm (circle) and 10 μm (triangle) SWNT channel lengths.

Last, the exciton loss mechanism was assessed for this embodiment by studying photocurrent dependence on illumination intensity for devices, such as devices 110, with 3, 5, 10 μm SWNT channel lengths. Log-log plot of short circuit photocurrent ($I_{sc}$) vs. illumination intensity (P) are shown in FIG. 4C. Under 532 nm monochromatic illumination, $I_{sc}$ increases linearly with P for devices with 3 μm (green square), 5 μm (green circle) and 10 μm (green triangle) SWNT lengths. It should be noted that such linear power dependence agrees with negligible bi-molecular recombination, suggesting fast carrier extraction from the heterojunction even for 10 μm long SWNT channels, Kymakis, N. Kornilios, E. Koudoumas, "Carbon nanotube doping of P3HT:PCBM photovoltaic devices". *J. Phys. D: Appl. Phys.* 41, 165110 (2008). In addition, a sub-linear dependence of $I_{sc} \sim P^x$ is observed under 800 nm illumination for 3 μm (red square), 5 μm (red circle) and 10 μm (red triangle) SWNT channel devices. It is believed that dissociation of low energy exciton creates trapped negative polarons in P3HT, leading to stronger charge recombination, J. Nelson, S. A. Choulis, J. Durrant, "Charge recombination in polymer/fullerene photovoltaic devices", *Thin Solid Films* 451, 508 (2004).

One factor which facilitated the highly efficient photocurrent generation in SWNT/P3HT hybrid devices as described herein is associated with fast carrier extraction. The time scale for hole extraction can be estimated as the length of nanotube divided by the drift velocity. With a typical nanotube hole mobility $\mu h \sim 10,000$ cm$^2$V$^{-1}$s$^{-1}$ and $V_{oc} \sim 0.1$ V, the order of magnitude hole extraction time for L=10 μm device can be calculated as $L^2/(\mu h \times V_{oc}) \sim 1$ ns. This time scale is much faster than the reported polaron lifetime reported in polythiophenes, E. Lioudaski, I. Alexandrou, A. "Ultrafast dynamics of localized and delocalised polaron transitions in P3HT/PCBM blend materials: The effects of PCBM concentration", *Nanoscale Res. Lett.* 4, 1475-1480 (2009) and S. Voigt, U. Zhokhavets, M. Al-Ibrahim, H. Hoppe, O. Ambacher, G. Gobsch, "Dynamical optical investigation of polymer/fullerene composite solar cells", *Phys. Stat. Sol.* (b) 245, 714-719 (2008). Unlike previous design, where nanotubes are blended with polymer, direct contacting to each individual nanotube thus ensures complete carrier extraction before they have a chance to recombine. In addition, our nanotube based hybrid photovoltaic design eliminates the constrain of selective synthesis/sorting of s-SWNTs, paving the way for low cost manufacturing of large scale bulk devices. Finally, the techniques proposed above can be readily applied to investigate different SWNT/polymer systems as well as graphene/polymer hybrid devices for future generation cost-efficient photovoltaics.

It will be appreciated by those skilled in the art that while the invention has been described above in connection with particular embodiments and examples, the invention is not necessarily so limited, and that numerous other embodiments, examples, uses, modifications and departures from the embodiments, examples and uses are intended to be encompassed by the claims attached hereto. Indeed, many modifications and variations of the embodiments of the invention are possible in light of the above teachings, and the invention may be practiced otherwise than as specifically described yet remain within the scope of the appended claims.

What is claimed is:

1. A photovoltaic device, comprising:
    a hole acceptor element, wherein the hole acceptor element comprises a carbon nanotube; and,
    an electron acceptor element, wherein the electron acceptor element comprises a layer of regioregular polymer in contact with at least a portion of the carbon nanotube and forming a heterojunction with the carbon nanotube, wherein the carbon nanotube acts as hole acceptor dissociating photogenerated excitons.

2. A photovoltaic device as recited in claim 1, wherein charge transfer to the carbon nanotube is facilitated by a built-in field created by regioregular polymer doping the carbon nanotube.

3. A photovoltaic device as set forth in claim 1, wherein the regioregular polymer is poly [3-hexylthiophene-2,5-diyl] or derivatives thereof.

4. A photovoltaic device as recited in claim 1, further comprising a first electrode and a second electrode.

5. A photovoltaic device as recited in claim 1, wherein the carbon nanotube is a single-walled carbon nanotube.

6. A photovoltaic device as recited in claim 1, wherein the carbon nanotube is a multi-walled carbon nanotube.

7. A photovoltaic device as recited in claim 4, wherein the first electrode is composed of a metal in contact with the carbon nanotube.

8. A photovoltaic device as recited in claim 4, wherein the second electrode is composed of a transparent conductor, such as indium tin oxide.

9. A photovoltaic device as recited in claim 4, further comprising a layer of SiO.sub.2 deposited over the first electrode.

10. A method of producing a photovoltaic device having a carbon nanotube and a layer of regioregular polymer which forms a heterojunction with the carbon nanotube, comprising the steps of:
    synthesizing a carbon nanotube on a quartz substrate using chemical vapor deposition;
    spin coating a layer of regioregular polymer over the carbon nanotube forming the heterojunction such that the carbon nanotube acts a hole acceptor;
    forming a first electrode in contact with the carbon nanotube;
    depositing a layer of SiO$_2$ over the first electrode; and
    forming a second electrode in contact with the substrate using RF sputtering.

11. A method as recited in claim 10, wherein the carbon nanotube is a single-walled carbon nanotube.

12. A method as recited in claim 10, wherein the carbon nanotube is a multi-walled carbon nanotube.

13. A device for photocurrent generation, comprising:
    a substrate composed substantially of an insulator material;
    a hole acceptor element comprising a single-walled carbon nanotube supported by the insulator substrate;
    a first electrode in contact with the carbon nanotube;
    a second electrode in electrical communication with the carbon nanotube; and
    an electron acceptor element comprising of a layer composed substantially of regioregular polymer disposed on the carbon nanotube, wherein the layer forms a heterojunction with the carbon nanotube.

14. A device as recited in claim 13, wherein the second electrode is fabricated of a transparent conductor material.

15. A device as recited in claim 13, wherein the carbon nanotube is either a m- or s-single-walled carbon nanotube.

16. A device as recited in claim 13, wherein the first electrode is a metal.

17. A device as recited in claim 13, wherein the regioregular polymer is a regioregular polythiophene.

18. A device as recited in claim 13, wherein the regioregular polymer is poly [3-hexylthiophene-2,5-diyl] or derivatives thereof.

19. A device as recited in claim 13, wherein the first electrode is substantially covered by an insulating material.

20. A device as recited in claim 13, wherein the second electrode is supported by the substrate.

* * * * *